United States Patent [19]

Williams et al.

[11] Patent Number: 4,539,278
[45] Date of Patent: Sep. 3, 1985

[54] MASK STRUCTURE FOR X-RAY LITHOGRAPHY AND METHOD FOR MAKING SAME

[75] Inventors: Bob J. Williams, San Jose; Daniel L. Brors, Los Altos, both of Calif.

[73] Assignee: Eaton Corporation, Cleveland, Ohio

[21] Appl. No.: 588,607

[22] Filed: Mar. 12, 1984

[51] Int. Cl.³ .............................................. G03F 9/00
[52] U.S. Cl. ....................................... 430/5; 430/966; 430/967; 378/35; 250/505.1
[58] Field of Search ................... 430/5, 966, 967, 321; 378/34, 35; 250/505.1

[56] References Cited

U.S. PATENT DOCUMENTS

| | | | |
|---|---|---|---|
| 4,037,111 | 7/1977 | Coquin et al. | 250/505 |
| 4,171,489 | 10/1979 | Adams et al. | 250/510 |
| 4,253,029 | 2/1981 | Lepselter et al. | 250/505 |
| 4,254,174 | 3/1981 | Flanders et al. | 428/209 |
| 4,260,670 | 4/1981 | Burns | 430/5 |
| 4,454,209 | 6/1984 | Blais | 430/5 |

OTHER PUBLICATIONS

Buckley et al., "X-Ray Lithography Mask Technology," Ninth International Conf. Electron Ion Beam Science and Technology, May 11–16, 1980, Report No. 14806.

*Primary Examiner*—John E. Kittle
*Assistant Examiner*—José G. Dees
*Attorney, Agent, or Firm*—C. H. Grace; F. M. Sajovec

[57] ABSTRACT

A mask substrate for use in X-ray lithography formed of a composite, X-ray transparent member which is stretched over a fixture to a predetermined tension and then adhered to a borosilicate glass ring. In accordance with a preferred embodiment, the composite member includes a film of polyborane which has been grown in compression, onto which a polyimide is coated. The polyborane film is grown on a silicon wafer, coated with the polyimide, after which the central area of the wafer is etched away. The borosilicate glass is adhered to the polyimide side of the composite, leaving the tensioned polyborane surface open for the application of an X-ray absorptive pattern thereto to define a complete mask structure suitable for use in X-ray lithography.

23 Claims, 9 Drawing Figures

MASK STRUCTURE FOR X-RAY LITHOGRAPHY AND METHOD FOR MAKING SAME

This invention relates to the fabrication of very-high-resolution devices and, more particularly, to mask structures for use in an X-ray lithographic system.

An important element in the production of a commercially feasible X-ray lithographic system is the provision of a suitable mask which comprises an X-ray transparent substrate having a pattern of X-ray-absorptive elements formed thereon. Various materials have been suggested for making the substrate of such a mask, including beryllium, which is characterized by low X-ray absorption but which is expensive, optically opaque and toxic. In addition, silicon structures having thin X-ray-transparent windows have been fabricated, but such structures are relatively fragile and optically transparent only to a partial extent.

The use of a thick membrane of Kapton polyimide film is suggested by U.S. Pat. No. 4,037,111, issued to G. A. Coquin, J. R. Maldonado and D. Maydan. (Kapton is a registered trademark of E. I. duPont de Nemours and Co.); however, it has been found that thermally induced dimensional changes in the film can cause unacceptable distortions to occur in the pattern formed on the film in certain applications.

Other known mask structures for X-ray lithography comprise a substrate made, for example, of boron nitride bonded to a support frame, which is optically transparent and substantially distortion free, but which is exceedingly fragile, difficult to handle and prone to breakage; and a composite substrate comprising one or more layers of boron nitride coated with a layer of a polyimide. U.S. Pat. No. 4,253,029 discloses such a composite mask substrate, which is mechanically strong and X-ray transparent. Such mask structure requires that the boron nitride film be grown in tension in order to achieve the required flatness and mechanical stability, which limits the size of the substrate which can be so formed. Also, further polishing steps prior to the application of the polyimide layer may still be required to achieve optimum flatness.

An object of the present invention is to provide a mask substrate for X-ray lithography which has the same favorable optical qualities of certain prior art masks, but which can be reliably produced in larger diameters than heretofore possible.

Another object of the invention is to provide a mask substrate which requires no additional finishing steps such as polishing at any point in the production of the substrate.

Another object of the invention is to provide a mask substrate comprising a composite, tensile, X-ray transparent member, the tension of which can be controlled more accurately than heretofore possible.

Another object of the invention is to provide a mask substrate formed of a film which has been formed in compression and which is then mechanically stretched onto a supporting structure at a predetermined tension.

Another object of the invention is to provide a mask structure comprising a tensile, composite, X-ray transparent substrate formed of a layer of an inorganic material and a layer of a polymeric material deposited on the inorganic layer, and a pattern of an X-ray absorptive material adhered to the open surface of the layer of inorganic material.

To provide the above mask structure, a compressive film of an inorganic, X-ray transparent material which has been coated with a layer of a polymeric material, is stretched over a fixture which applies a predetermined tensile stress to the film; after which the polymeric layer of the tensile film is bonded to a support ring formed of a borosilicate glass such as Pyrex (Pyrex is a registered trademark of Corning Glass Works). A mask pattern is then applied to the open surface of the inorganic material.

In accordance with a preferred embodiment of the invention the inorganic film is a film of polyborane which has been grown in compression, and the polymeric material is a polyimide.

Other objects and advantages of the invention will be apparent from the following description, when considered in connection with the accompanying drawings, wherein.

Figure 1:
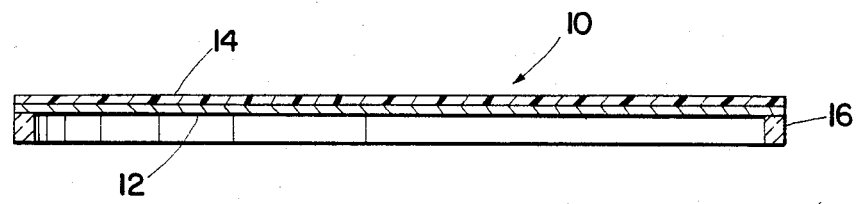
FIG. 1 is a cross-sectional view of a polyimide-coated polyborane film adhered to a silicon ring prior to stretching.

Referring to FIG. 1, there is illustrated a composite substrate 10 comprising a film 12 of an inorganic material such as polyborane onto which has been coated a polymeric film of a material such as a polyimide 14. The film 12 is adhered to a silicon ring 16. The substrate 10 as shown in FIG. 1, can be formed in any one of several different ways; however, a particularly effective method has been found to be to form a compressive film of polyborane in a plasma enhanced LPCVD by mixing $B_2H_6$ and $NH_3$ in an inert carrier gas. The polyborane film is grown to a thickness in the range from 2 microns to 6 microns with the compressive state of the film controlled by controlling the pressure under which the deposition is carried out and/or the $B_2H_6/NH_3$ ratio. Following the polyborane deposition, a polyimide is applied to the polyborane surface by spinning, with the spin speed adjusted to produce a polyimide thickness which is equal to or slightly less than the polyborane thickness.

The periphery of the uncoated side of the wafer is then masked, and with the wafer mounted in a suitable etch fixture which protects the polyimide from etching acids, the central back portion of the silicon is acid-etched away, leaving the substrate 10 as shown in FIG. 1.

Referring to FIG. 2, the substrate 10 is placed over a stretch fixture, designated generally by the numeral 18, which comprises a base member 20, and a weight 22. In the illustrative embodiment, the base member 20 comprises a circular base portion 24 and an upstanding ring portion 26 having an outer diameter somewhat smaller than the inner diameter of the silicon ring. The weight 22 has an inner diameter which is slightly greater than the outer diameter of the ring portion 26 and is calibrated to apply the desired tension to the substrate 10.

Figure 2A:
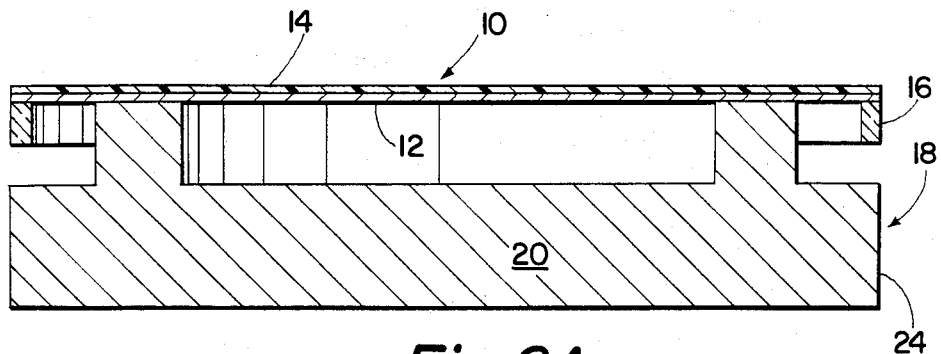
FIGS. 2A–2F are cross-sectional views illustrating the steps in forming a mask substrate.
Figure 2B:
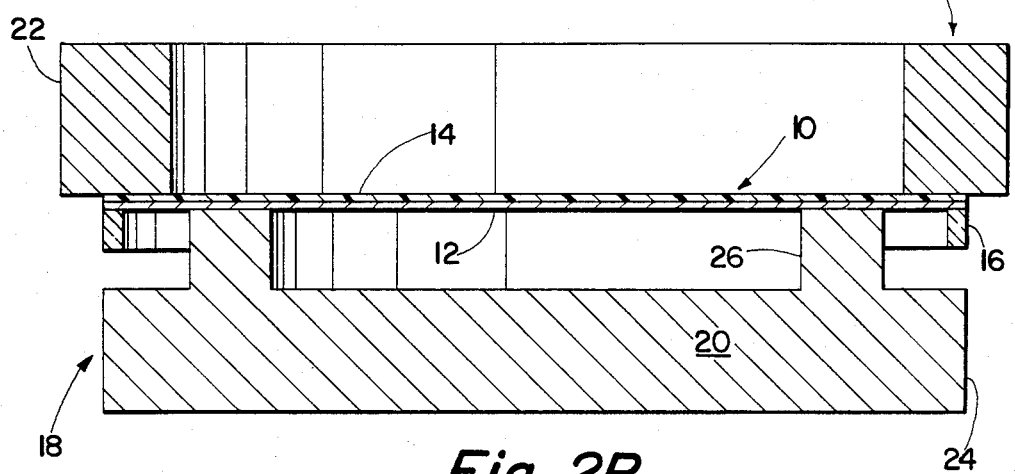
Figure 2C:
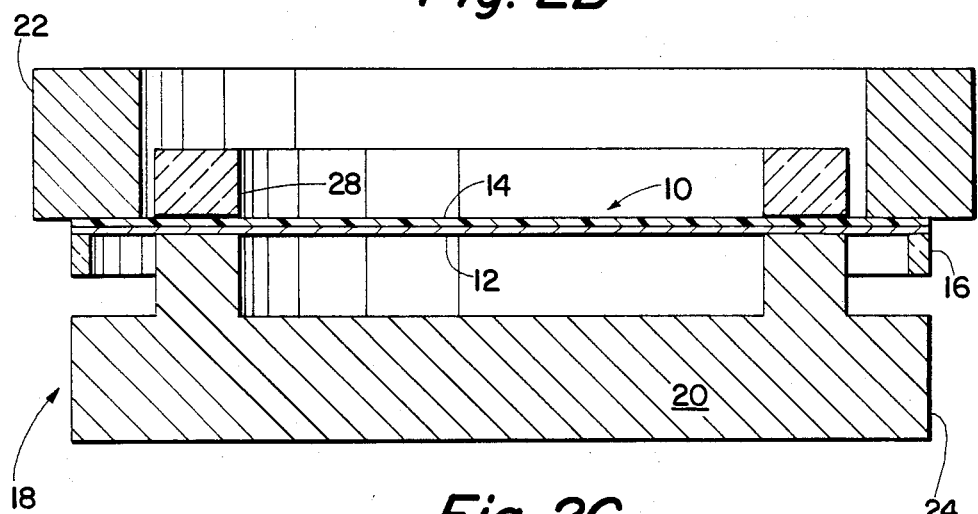
Figure 2D:
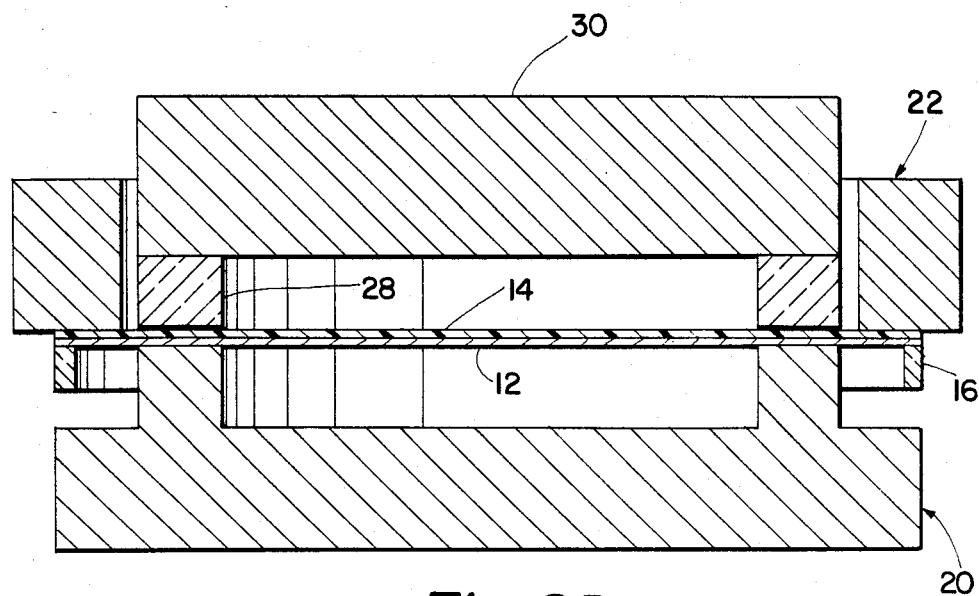

After the weight 22 is in place, as shown in FIG. 2B, a Pyrex ring 28 is epoxied or otherwise adhered to the polyimide layer 14, as shown in FIG. 2C. A second weight 30 is then placed on the Pyrex ring, as shown in FIG. 2D and the epoxy is permitted to cure for an appropriate time period.

Figure 3:
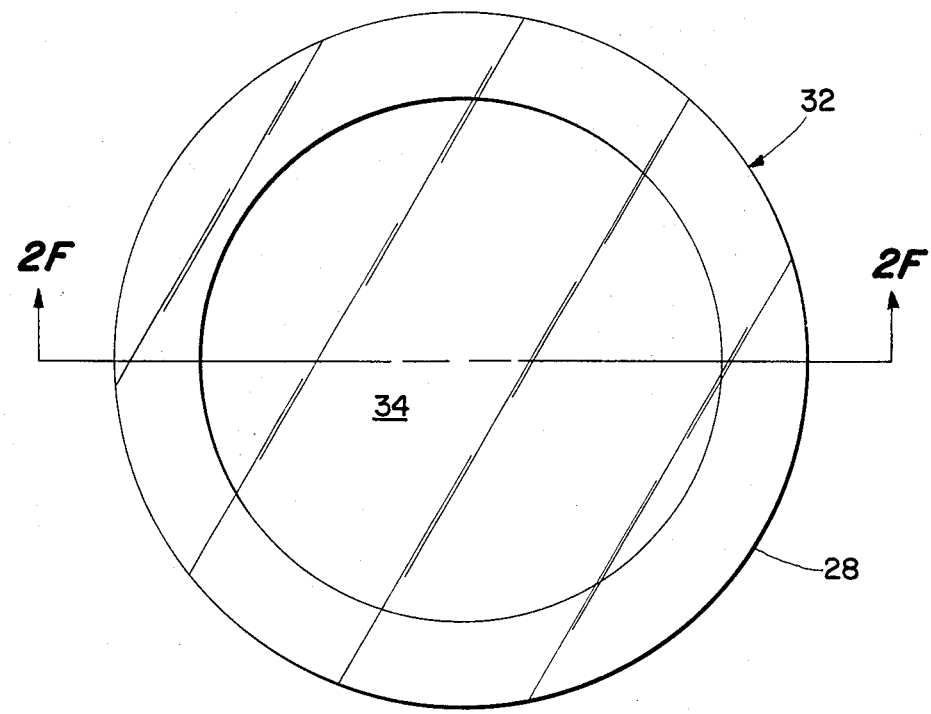
FIG. 3 is a plan view of a completed mask substrate.
Figure 2E:
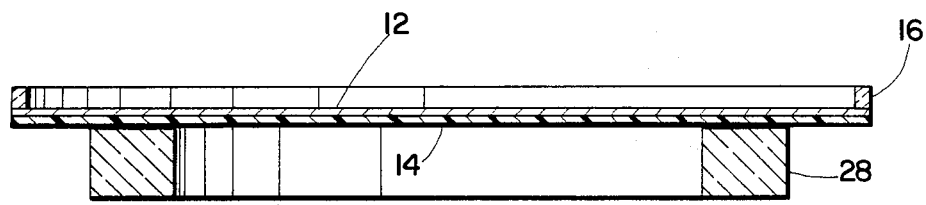
Figure 2F:
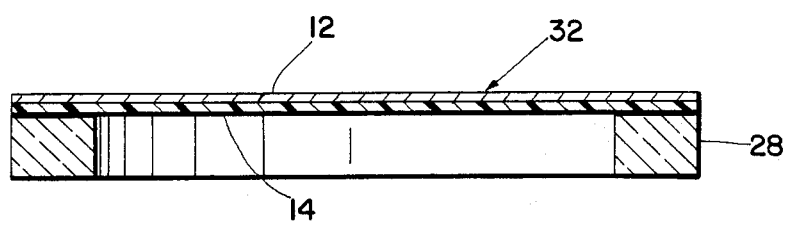

After the epoxy has cured, the weights are removed, leaving the substrate 10, now in a tensile condition, adhered to the Pyrex ring 28, as shown in FIG. 2E, after which the excess composite film and silicon ring are trimmed away, yielding a finished mask substrate 32 as shown in FIG. 2F. Referring to FIGS. 2F and 3, the finished substrate 32 comprises a tensile composite film including a polyimide layer 14 and a polyborane layer 12 having a transmissive area 34, supported by the Pyrex ring 28.

The above describes what is considered to be a preferred embodiment of the inventive mask substrate, and a preferred method for forming that substrate. It can be appreciated that the method can be applied to films which are initially grown in tension as well as in compression. Also, the inorganic film can be one of a number of inorganic materials which is inherently stable and chemically inert, and which is preferably but not necessarily a refractory material, while the polymeric material which is coated onto the inorganic film can be one of a number of polymers which is low in metallic ion content, is optically clear, has good thermal stability, and which preferably has a tensile strength of at least 15,000 psi. Examples of additional suitable inorganic materials are boron nitride, boron carbide, silicon nitride or silicon carbide. Examples of suitable polymers are Kapton, referred to above, and PIQ, which is a polyimide available from Hitachi Chemical Company.

Figure 4:
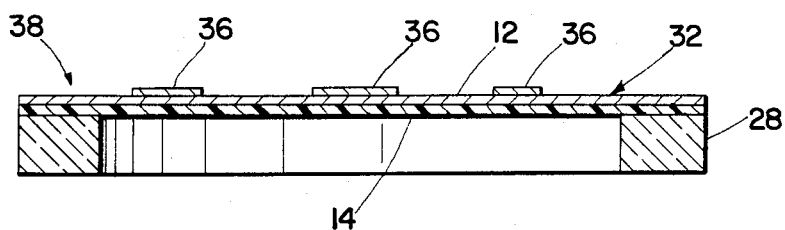
FIG. 4 is a cross-sectional view of a mask substrate having a mask pattern formed thereon.

As illustrated in FIG. 4, a pattern of an X-ray absorptive material 36 such as gold is applied to the polyborane layer 12 of the mask substrate, in accordance with practices well known in the art, to provide a finished mask structure 38 suitable for use in X-ray lithography.

We claim:

1. A method for forming a mask substrate for X-ray lithography comprising the steps of:
   a. forming a film of a first X-ray transparent material on a support member;
   b. coating said film with a layer of a second X-ray transparent material;
   c. etching away the central area of said support member, leaving a composite X-ray transparent member adhered to a first ring;
   d. placing said composite member on a second ring with the first X-ray transparent material in contact therewith, said second ring having an outer diameter somewhat smaller than the inner diameter of said first ring;
   e. applying a predetermined force to the edge of said composite member extending beyond the outer diameter of said second ring to put said composite member in tension;
   f. while said predetermined force is being applied, adhering a third ring to said layer of said second X-ray transparent material;
   g. removing the force applied in step (e); and
   h. trimming away any of said composite member and said first ring extending beyond the outer diameter of said second ring.

2. A method as claimed in claim 1, in which said first X-ray transparent material is an inorganic material.

3. A method as claimed in claim 1 in which said second X-ray transparent material is a polymeric material.

4. A method as claimed in claim 1, in which said first X-ray transparent material is a refractory, chemically inert inorganic material.

5. A method as claimed in claim 1, in which said first X-ray transparent material is polyborane.

6. A method as claimed in claim 1, in which said first X-ray transparent material is compressive polyborane.

7. A method as claimed in claim 1, in which said second X-ray transparent material is a polymer which is low in metallic ion content, and which has a tensile strength of at least 15,000 psi.

8. A method as claimed in claim 1, in which said second X-ray transparent material is a polyimide.

9. A method as claimed in any one of claims 1 through 8, in which said support member is silicon.

10. A method as claimed in claim 9, in which said third ring is formed of a borosilicate glass material.

11. A method as claimed in claim 1, in which said second ring is in the form of a cylinder upstanding from a horizontally disposed base member, and said force is applied by placing a fourth ring member of predetermined weight on said composite member.

12. A method for forming a mask structure for X-ray lithography comprising the steps of:
   a. forming a film of a first X-ray transparent material on a support member;
   b. coating said film with a layer of a second X-ray transparent material;
   c. etching away the central area of said support member, leaving a composite X-ray transparent member adhered to a first ring;
   d. placing said composite member on a second ring with the first X ray transparent material in contact therewith, said second ring having an outer diameter somewhat smaller than the inner diameter of said first ring;
   e. applying a predetermined force to the edge of said composite member extending beyond the outer diameter of said second ring to put said composite member in tension;
   f. while said predetermined force is being applied, adhering a third ring to said layer of said second X-ray transparent material;
   g. removing the force applied in step (e);
   h. trimming away any of said composite member and said first ring extending beyond the outer diameter of said second ring; and
   i. depositing a pattern of an X-ray absorptive material to the open surface of said first X-ray transparent material.

13. A method as claimed in claim 12, in which said first X-ray transparent material is polyborane, and said second X-ray transparent material is a polyimide.

14. A mask structure for X-ray lithography comprising a compressive inorganic X-ray transparent member, a polymeric X-ray transparent layer deposited on said compressive inorganic member, said inorganic member and said polymeric layer being mechanically tensioned to define a tensile composite substrate for supporting an X-ray absorptive pattern on the free surface of said inorganic member, and a support ring adhered to said polymeric layer.

15. A mask structure for X-ray lithography comprising a compressive inorganic X-ray transparent member, a polymeric X-ray transparent layer deposited on said compressive inorganic member, said inorganic member and said polymeric layer being mechanically tensioned to define a tensile composite substrate, a support ring adhered to said polymeric layer, and an X-ray absorptive pattern deposited on said inorganic member.

16. An article as claimed in claims 14 or 15 in which said inorganic material is polyborane.

17. An article as claimed in claims 14 or 15 in which said polymeric layer is a polymer which is low in metal ion content, and which has a tensile strength of at least 15,000 psi.

18. An article as claimed in claims 14 or 15 in which said polymeric layer is a polyimide.

19. An article as claimed in claims 14 or 15 in which said inorganic material is a layer of polyborane having a thickness of at least 2 microns and said polymeric layer is a polyimide, said polyborane layer and said polyimide layer being of approximately the same thickness.

20. A mask substrate for X-ray lithography; said substrate being formed by a process comprising forming a film of an inorganic X-ray transparent material, coating said film with a layer of a polymeric X ray transparent material to define a composite X-ray transparent member, applying a predetermined tensile force to said composite member, and adhering a support ring to said polymeric layer to define a tensile composite substrate having a free surface of said inorganic X-ray transparent film available for the deposition of an X-ray absorptive pattern thereon.

21. A mask structure for X-ray lithography; said mask structure being formed by a process comprising forming a film of an inorganic X-ray transparent material, coating said film with a layer of a polymeric X-ray transparent material to define a composite X-ray transparent member, applying a predetermined tensile force to said composite member, adhering a support ring to said polymeric layer, and depositing a pattern of an X-ray absorptive material on the inorganic film.

22. An article as claimed in claims 20 or 21 in which said inorganic material is polyborane.

23. An article as claimed in claims 20 or 21, in which said polymeric material is a polyimide.

* * * * *